June 27, 1967 C. E. DOWDELL, JR 3,328,730

MICROWAVE DIODE MOUNT

Filed March 8, 1965

INVENTOR
CHARLES E. DOWDELL, JR.

BY Stanley M. Schurgin

ATTORNEY 3,328,730

MICROWAVE DIODE MOUNT

Charles E. Dowdell, Jr., Williamsville, N.Y., assignor to Sylvania Electric Products Inc., a corporation of Delaware Filed Mar. 8, 1965, Ser. No. 437,880
4 Claims. (Cl. 333—84)

This invention relates to microwave stripline circuits and more particularly to devices for mounting diodes thereon.

In microwave stripline circuits, it is often necessary to mount a component such as a semiconductor diode in the circuit in shunt with the inner and outer conductors. Many devices to mount these diodes have been disclosed in the past, but are deficient for one reason or another. In one known arrangement, the diode is mounted in a coaxial holder attached to the edge of the stripline board and connection made to one diode terminal via a branch line from the stripline center conductor, the other diode terminal being connected to the ground plane. In this device, the diode cannot be located close to the stripline center conductor thereby disturbing the impedance of the circuit. In addition, this edge mounting arrangement is mechanically unattractive since the diode holder extends out from the otherwise compact circuit package and is susceptible to damage. Another known mounting arrangement employs a diode in a coaxial holder located normal to the stripline board with connection being made to the center conductor via a connecting pin extending from the center conductor of the stripline. This mounting arrangement also causes impedance matching problems, is structurally unattractive, and provides poor thermal sinking. A further deficiency of both of these mounting schemes is that tuning must be accomplished, if at all, by a tuning stub associated with the diode mount, which further complicates the packaging and construction of the mount. It would be advantageous, and it is an object of the invention, to provide a diode mount which is contained within the stripline circuit and by which the diode itself can be tuned without the need of additional tuning elements. A further object is to provide a tunable diode mount which also provides good heat sinking.

Briefly, the invention resides in the use of a diode threadably mounted within the stripline circuit. One diode terminal contacts the center stripline conductive via an adjustable contact, while the other diode terminal is adjustably engaged by the ground plane. In one embodiment, a spring clip is disposed in contact with the stripline center conductor and slidably engages one diode terminal. The other diode terminal has a threaded portion which threads into a corresponding hole in the stripline ground plane. Alternatively, the diode can be threadably connected to the center conductor, while the ground plane makes slidable contact with the other diode terminal. In either case, the diode is mounted within the stripline circuit package and is tunable simply by adjusting its position in a threaded hole.

The invention will be more fully understood from the followin gdetailed description, taken in conjunction with the accompanying drawings, in which.

Figure 1:
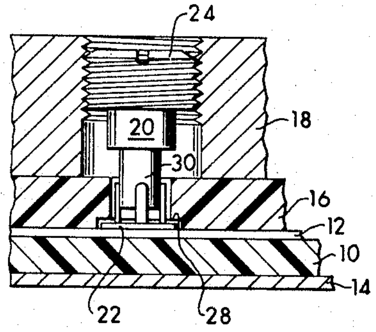
FIG. 1 is an enlarged sectional view of a stripline circuit incorporating the present invention.
Figure 2:
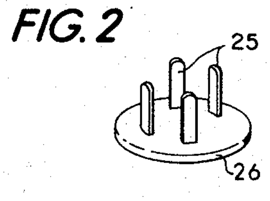
FIG. 2 is an enlarged pictorial view of a spring clip useful in the invention.

Referring to FIG. 1, there is shown a stripline circuit including a dielectric board 10 having a strip circuit 12 formed thereon, for example by etching, and a conductive ground plane 14 formed on the outer side of the board. A second dielectric board 16 confronts strip circuit 12 and has a ground plane 18 formed on the outer side thereof which may be somewhat thicker than ground plane 14. In accordance with the present invention, the microwave diode 20 is mounted within the stripline circuit by means of a mounting clip 22 and a threaded connection 24. Clip 22 is seen more clearly in FIG. 2 and consists of a plurality of fingers 25 circumferentially disposed and upstanding from a circular base portion 26. The clip is made of strong resilient material such as heat treated beryllium copper. Base portion 26 is placed in contact with center conductor 12 of the stripline circuit and is properly located in the circuit, for example, by a suitable recess 28 in dielectric board 16. It is evident that the shape of the base portion of clip 22 can be suitably altered to mate with the particular center conductor configuration with which it is employed. When the dielectric boards are fastened together, base portion 26 is forced against the center conductor sufficiently to provide good electrical contact. Diode 20 has one terminal 30 which is dimensioned to be snugly inserted int othe conductive fingers of clip 22. The other diode terminal 24 is threaded and is accommodated by a similarly threaded hole provided in ground plane 18. This ground plane is made sufficiently thick to rigidly mount the diode and also to provide space for the diode to be threadably adjusted. The diode is, therefore, located within the stripline circuit and does not detract from the compact planar stripline package. In addition, good heat sinking is assured by the diode connection to group plane 18, and tuning is easily accomplished by adjusting the threaded terminal 24 of the diode in or out of the threaded hole as required, the other terminal 30 slidably adjusting itself within the fingers of clip 22.

Figure 3:
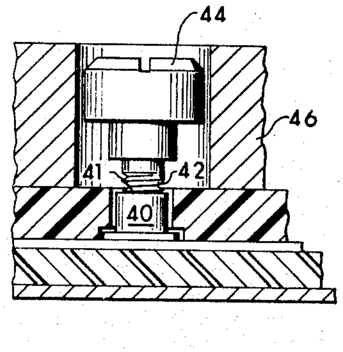
FIG. 3 is an enlarged sectional view of an alternative embodiment of the invention.

An alternative embodiment ofthe invention is illustrated in FIG. 3 wherein a clip 40 is provided with a threaded portion 41, rather than having a threaded hole in the ground plane. In this embodiment, a diode is employed having a threaded terminal 42 dimensioned to fit the threaded portion of clip 40, the other terminal 44 being slidably mounted within a hole provided in ground plane 46. Resilient fingers, similar to those of clip 22, could be provided in the ground plane opening to assure good electrical and thermal contact.

Figure 4:
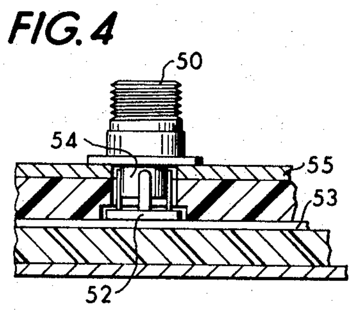
FIG. 4 is an enlarged sectional view of a variation of the invention.
Figure 5:
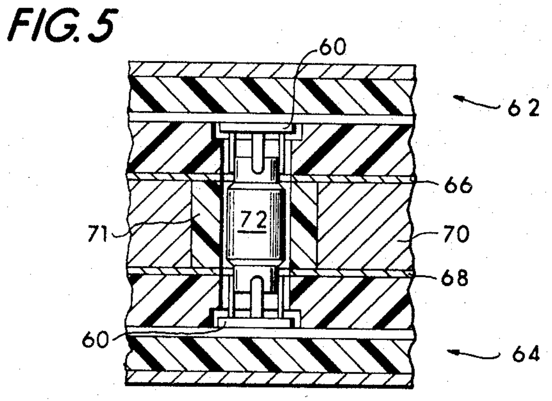
FIG. 5 is an enlarged sectional view of another variation of the invention.

Variations of the diode mounting techniques described herein can be used to provide coaxial transitions and interconnections between stripline packages, as illustrated in FIGS. 4 and 5, respectively. As seen in FIG. 4, a coaxial connector 50 can be connected to the stripline circuit via a clip 52 of the type described above. The clip is disposed in contact with the stripline center conductor 53, as in FIG. 1, and the center conductor 54 of the coaxial connector is designed to positively engage the resilient fingers of clip 52. Connection to the ground plane 55 is accomplished through the body of connector 50 which is secured to the ground plane.

Interconnection between stripline circuits can be accomplished as shown in FIG. 5. A pair of clips 60 are provided in circuit packages 62 and 64, which are to be interconnected. Ground planes 66 and 68 are connected via plate 70 which has an insulating spacer 71 provided to accommodate conductive pin 72. Pin 72 has end portions dimensioned to engage the fingers of respective clips 60, thereby providing connection between the stripline center conductors.

From the foregoing, it is evident that a diode mounting technique has been provided wherein the diode is tunably mounted within the stripline circuit, such mounting also affording good mechanical and thermal connection. The illustrated embodiments are exemplary only and it is not intended to limit the scope of the invention by what has been particularly shown and described, except as indicated in the appended claims.

I claim:

1. A diode mounting assembly comprising, in combination, a microwave stripline circuit including first and second ground planes and a conductive pattern disposed therebetween, a two terminal diode disposed within said stripline circuit in shunt with said conductive pattern and said first ground plane, said first ground plane having an opening therein adjustably engaging the first terminal of said diode, and a connector secured in contact with said conductive pattern and adjustably engaging the second terminal of said diode, said diode being tunable by adjusting its position in said opening and connector.

2. An assembly in accordance with claim 1 wherein the opening in said first ground plane is threaded, the first terminal of said diode is threaded and threadably engaged in the threaded opening in said first ground plane, and said connector comprises a clip having a base portion and a plurality of fingers circumferentially disposed and upstanding therefrom, said base portion being secured in contact with said conductive pattern and said fingers slidably engaging the second terminal of said diode.

3. An assembly in accordance with claim 1 wherein the opening in said first ground plane slidably engages the first terminal of said diode, said connector has a base portion and a threaded receptacle upstanding therefrom, said base portion being secured in contact with said conductive pattern, and the second terminal of said diode is threaded and threadably engaged in the threaded receptacle of said connector.

4. An assembly in accordance with claim 2 wherein said conductive pattern is a center conductor, said stripline circuit further includes first and second dielectric boards which respectively space the first and second ground planes from said center conductor, said diode is a semiconductor diode with its first terminal being on one end thereof and its second terminal being on the other end thereof, the second terminal of said diode is cylindrical, and said connector is composed of a conductive material and disposed in an opening provided in said first dielectric board.

References Cited

UNITED STATES PATENTS

| | | | |
|---|---|---|---|
| 2,647,210 | 7/1953 | Davis | 329—161 X |
| 2,938,175 | 5/1960 | Sommers et al. | 329—160 |
| 3,246,265 | 4/1966 | Smith-Vaniz | 333—84 X |

LEWIS H. MYERS, *Primary Examiner.*

D. L. CLAY, *Examiner.*